(12) United States Patent
Kitazawa et al.

(10) Patent No.: US 7,109,531 B2
(45) Date of Patent: Sep. 19, 2006

(54) HIGH FREQUENCY SWITCH, TWO-BAND TYPE HIGH FREQUENCY SWITCH, THREE-BAND TYPE HIGH FREQUENCY SWITCH, AND MOBILE COMMUNICATION EQUIPMENT

(75) Inventors: Shoichi Kitazawa, Nishinomiya (JP); Masaharu Tanaka, Uji (JP); Toshio Ishizaki, Kobe (JP); Toru Yamada, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 84 days.

(21) Appl. No.: 10/975,155

(22) Filed: Oct. 28, 2004

(65) Prior Publication Data
US 2005/0056860 A1    Mar. 17, 2005

Related U.S. Application Data

(62) Division of application No. 10/382,011, filed on Mar. 5, 2003, now Pat. No. 6,835,968, which is a division of application No. 10/032,856, filed on Dec. 27, 2001, now Pat. No. 6,586,786.

(30) Foreign Application Priority Data
Dec. 27, 2000    (JP)    ............... 2000-397649

(51) Int. Cl.
    $H01L\ 29/74$    (2006.01)
(52) U.S. Cl. .............. 257/107; 257/275; 257/342; 257/728; 257/664; 257/724; 257/277; 257/337

(58) Field of Classification Search ............... 257/107, 257/275, 342, 728, 664, 724, 277, 337
See application file for complete search history.

(56) References Cited

U.S. PATENT DOCUMENTS
6,442,376 B1 *    8/2002    Furutani et al. .............. 455/82

FOREIGN PATENT DOCUMENTS
JP    06-197043    7/1994

\* cited by examiner

*Primary Examiner*—Eddie C. Lee
*Assistant Examiner*—Junghwa Im
(74) *Attorney, Agent, or Firm*—RatnerPrestia

(57) ABSTRACT

A high frequency switch, has a transmitting terminal, a receiving terminal, an antenna terminal, a first diode having an anode electrically connected to the transmitting terminal and a cathode electrically connected to the antenna terminal, a second diode having an anode connected through a transmission line of ¼ wavelength to the antenna terminal which is electrically connected to the receiving terminal, and having the side of a cathode grounded, and a control terminal provided to a node between the transmitting terminal and the first anode. The first and second diodes have a tradeoff relationship between ON resistance thereof and capacitance between the anode and the cathode, and the ON resistance of the first diode is lower than the ON resistance of the second diode, and the capacitance of the second diode in the OFF state is smaller than the capacitance of the first diode in the OFF state.

8 Claims, 10 Drawing Sheets

HIGH FREQUENCY SWITCH, TWO-BAND TYPE HIGH FREQUENCY SWITCH, THREE-BAND TYPE HIGH FREQUENCY SWITCH, AND MOBILE COMMUNICATION EQUIPMENT

This application is a divisional of U.S. patent application Ser. No. 10/382,011, filed Mar. 5, 2003, now U.S. Pat. No. 6,835,968, which is a divisional of U.S. patent application Ser. No. 10/032,856, filed Dec. 27, 2001, now U.S. Pat. No. 6,586,786 Issued Jul. 1, 2003.

BACKGROUND OF THE INVENTION

1. Field of the Invention

The present invention relates to a high frequency switch or the like, of which main object is to switch a high frequency signal in a radio circuit of radio communication equipment such as a portable telephone.

2. Description of the Prior Art

High frequency switch circuits are often used to switch transmit/receive signals in radio circuits of radio communication equipment such as a portable telephone using TDMA systems.

Hereinafter, an example of conventional high frequency switch circuits described above will be described with reference to a drawing.

FIG. 13 shows an equivalent circuit diagram of an example of conventional high frequency switch circuits.

In FIG. 13, the anode of a first diode D1301 is coupled to a transmitting terminal 1301 through a first capacitor element C1301. Further, a control terminal 1302 is coupled to the anode side of the first diode D1301 through an inductor element L1301 and a resistor element R1301. Also, the anode of a second diode D1302 is coupled to a receiving terminal 1303 through a second capacitor element C1302, and the cathode of the second diode is connected to ground. Further, one end of a first transmission line TL1301, which has an electrical length of ¼ wavelength at the operating frequency, is connected also to the anode side of the second diode D1302. The other end of the first transmission line is connected to the cathode of the first diode D1301, and also coupled to an antenna terminal 1304 through a third capacitor element C1303. Here, in order to decrease the variety of components to be used and thereby to reduce cost, usually, diodes having the same characteristics are used for the first diode D1301 and the second diode D1302.

The operation of the high frequency circuit configured as described above will be described.

In transmitting, when a positive voltage is applied to the control terminal 1302, the first diode D1301 and the second diode D1302 are turned on. At this time, the capacitor elements C1301, C1302, and C1303 block components of direct current. A transmit signal passes through the capacitor C1301 from the transmitting terminal 1301 and is transmitted to the antenna terminal 1304 through the first diode D1301 and the capacitor element C1303. Herein, the transmission line TL1301 operates as a ¼ wavelength resonator having one end grounded, because the second diode D1302 is turned on. Therefore, the impedance of lines in the side of the antenna terminal 1304 becomes infinite and therefore no transmit signal is transmitted to the receiving side.

In receiving, no voltage is applied to the control terminal 1302, and therefore both the first diode D1301 and the second diode D1302 are in the OFF state. Thus, a receive signal is transmitted to the receiving terminal 1303 from the antenna terminal 1304 through the capacitor element C1303, the transmission line TL1301, and the capacitor element C1302.

PIN diodes are mainly used for the first diode D1301 and the second diode D1302, which are used for switching. However, generally, diodes have a tradeoff relationship that a diode of low ON resistance has a large capacitance between the cathode and anode terminals and a diode having a small inter-terminal capacitance in the OFF state has a high ON resistance.

Therefore, if importance is attached on isolation during receiving and therefore a diode having a small inter-terminal capacitance is selected to achieve high isolation, the signal path produces a large loss during transmitting because of the large ON resistance of the diode.

On the other hand, when importance is attached on insertion loss during transmitting and therefore a diode of a low ON resistance is selected, then there is a problem that the increased inter-terminal capacitance reduces isolation to result in a large loss produced by the signal path during receiving.

BRIEF SUMMARY OF THE INVENTION

The present invention has been achieved in view of such problems, and has an object to provide a high frequency switch favorably reducing loss produced in signal paths both during transmitting and during receiving.

One aspect of the present invention is a high frequency switch, comprising:

a transmitting terminal;

a receiving terminal;

an antenna terminal;

a first diode having an anode electrically connected to said transmitting terminal and a cathode electrically connected to said antenna terminal;

a second diode having an anode connected through a transmission line of ¼ wavelength to the antenna terminal which is electrically connected to said receiving terminal, and having the side of a cathode grounded; and a control terminal provided to a node between said transmitting terminal and said first anode, wherein said first and second diodes have a tradeoff relationship between ON resistance thereof and capacitance between said anode and said cathode, and the ON resistance of the first diode is lower than the ON resistance of the second diode, and the capacitance of the second diode in the OFF state is smaller than the capacitance of the first diode in the OFF state.

Another aspect of the present invention is the high frequency switch, wherein a diode having a ON resistance of not higher than 1Ω is used for said first diode and a diode having an inter-terminal capacitance of not larger than 0.8 pF in the OFF state is used for said second diode.

Still another aspect of the present invention is the high frequency switch, wherein a diode having a ON resistance of not higher than 0.8Ω is used for said first diode and a diode having an inter-terminal capacitance of not larger than 0.5 pF in the OFF state is for said second diode.

Yet still another aspect of the present invention is the high frequency switch, further comprising an inductor element or a series circuit of LC connected in parallel with said first diode.

Still yet another aspect of the present invention is the high frequency switch, further comprising a capacitor element or a parallel circuit of LC connected in series with said second diode.

A further aspect of the present invention is a high frequency switch, comprising:

a laminated component having a plurality of dielectrics laminated therein;

a transmitting terminal, a receiving terminal, an antenna terminal, a control terminal, a ground terminal, and an electrode pattern for connecting a part, which are provided on the surface of said laminated component;

a first diode having an anode electrically connected to said transmitting terminal and having a cathode electrically connected to said antenna terminal; and a second diode having an anode connected through a transmission terminal of ¼ wavelength to the antenna terminal which is electrically connected to said receiving terminal, and having the side of a cathode grounded, said first and second diodes being mounted on the surface of said laminated component, wherein said first and second diodes have a tradeoff relationship between ON resistance thereof and capacitance between said anode and said cathode, and the ON resistance of the first diode is lower than the ON resistance of the second diode, and the capacitance of the second diode in the OFF state is smaller than the capacitance of the first diode in the OFF state.

A still further aspect of the present invention is the high frequency switch, wherein said high frequency switch is configured by using the laminated component.

A yet further aspect of the present invention is a two-band type of high frequency switch, comprising:

a first high frequency switch for use in a first frequency band;

a second high frequency switch for use in a second frequency band higher than the first frequency band; and a divider for sharing the same antenna between said first high frequency switch and said second high frequency switch by multiplexing and demultiplexing said first frequency band and second frequency band, the antenna terminal of said first high frequency switch and the antenna terminal of said second high frequency switch being electrically connected to each other, wherein the high frequency switch is used for said first high frequency switch and said second high frequency switch.

A still yet further aspect of the present invention is the two-band type of high frequency switch, wherein the ON resistance of said first diode of said second high frequency switch is made lower than the ON resistance of said first diode of said first high frequency switch, and the capacitance of said second diode, in the OFF state, of said second high frequency switch is made smaller the capacitance of said second diode, in the OFF state, of said first high frequency switch.

An additional aspect of the present invention is the two-band type of high frequency switch, wherein the ON resistance of said first diode of said first high frequency switch is not higher than 1Ω and the ON resistance of said first diode of said second high frequency switch is not higher than 0.8Ω, and the capacitance of said second diode, in the OFF state, of said first high frequency switch is not larger than 0.8 pF, and the capacitance of said second diode, in the OFF state, of said second high frequency switch is not larger than 0.5 pF.

A still additional aspect of the present invention is the two-band type of high frequency switch, wherein a transmitting terminal, a receiving terminal, and a control terminal of said first high frequency switch, a transmitting terminal, a receiving terminal, and a control terminal of said second high frequency switch, and the antenna terminal common to said first high frequency switch and said second high frequency switch are provided on the surface of a laminated component having a plurality of dielectrics laminated therein, along with a ground terminal as electrode patterns for connecting parts, and said first high frequency switch, said second high frequency switch, and said divider are provided in the interior of said laminated component, and said first diode and said second diode are mounted on the surface of said laminated component.

A yet additional aspect of the present invention is a three-band type of high frequency switch, comprising:

a first high frequency switch for use in a first frequency band;

a second high frequency switch for use in a second frequency band higher than the first frequency band;

a third high frequency switch for use in a third frequency band higher than the first frequency band;

a divider for sharing the same antenna among said first high frequency switch, said second high frequency switch, and said third high frequency switch, by multiplexing and demultiplexing said first frequency band, said second frequency band and said third frequency band, the antenna terminal of said first high frequency switch and the antenna terminal of said second high frequency switch being electrically connected to each other, wherein the high frequency switch is used for said first high frequency switch and said second high frequency switch, and said third high frequency switch has a third diode having a cathode connected to between said antenna terminal and a node of the cathode of said first diode and said transmission line and having an anode connected to a second receiving terminal, and a second control terminal connected to between said third diode and said second receiving terminal, said third high frequency switch using the transmitting terminal of said first high frequency switch as a second transmitting terminal thereof, and said third high frequency switch operating on the receiving side, by using said second diode of said second high frequency switch.

A still yet additional aspect of the present invention is the three-band type of high frequency switch, wherein the ON resistance of said first diode of said second high frequency switch and said third diode of said third high frequency switch are made lower than the ON resistance of said first diode of said first high frequency switch, and the capacitance of said second diode, in the OFF state, of said second high frequency switch is made smaller than the capacitance of said second diode, in the OFF state, of said first high frequency switch.

A supplementary aspect of the present invention is the three-band type of high frequency switch, wherein the ON resistance of said third diode of said third high frequency switch is lower than the ON resistance of said first diode of said second high frequency switch.

A still supplementary aspect of the present invention is the three-band type of high frequency switch, wherein the ON resistance of said first diode of said first high frequency switch is not higher than 1Ω, and the ON resistance of said first diode of said second high frequency switch and said third diode of said third high frequency switch is not higher than 0.8Ω, and the capacitance of said second diode, in the OFF state, of said first high frequency switch is not larger than 0.8 pF, and the capacitance of said second diode, in the OFF state, of said second high frequency switch is not larger than 0.5 pF.

A yet supplementary aspect of the present invention is the three-band type of high frequency switch, wherein the ON resistance of said third diode of said third high frequency switch is made not higher than 0.5Ω.

A still yet supplementary aspect of the present invention is the three-band type of high frequency switch, wherein the transmitting terminal, receiving terminal, and control terminal of said first high frequency switch, the transmitting terminal, receiving terminal, and control terminal of said second high frequency switch, the receiving terminal and control terminal of said third high frequency switch, and the antenna terminal common to said first high frequency switch, said second high frequency switch, and said third high frequency switch are provided on the surface of a laminated component having a plurality of dielectrics laminated therein, along with a ground terminal as electrode patterns for connecting parts, and electrode patterns for configuring said first high frequency switch, said second high frequency switch, said third high frequency switch, and said divider are provided in the interior of said laminated component, and said first diode, said second diode, and said third diode are mounted on the surface of said laminated component.

Another aspect of the present invention is radio communication equipment, comprising:

an antenna;

transmitting means for transmitting a signal from said antenna;

receiving means for receiving a signal from said antenna; and switch means for switching the connection between said antenna and said transmitting means or said receiving means, wherein the high frequency switch is used for said switch means.

DESCRIPTION OF SYMBOLS

111, 201, 301, 401, 501, 601, 701, 801, 811, 1101, 1111, 1301 . . . Transmitting terminal
112, 202, 302, 402, 502, 602, 702, 802, 812, 1102, 1112, 1302 . . . Control terminal
113, 203, 303, 403, 503, 603, 703, 803, 813, 1103, 1113, 1123, 1303 . . . Receiving terminal
114, 204, 304, 404, 504, 604, 704, 804, 814, 1104, 1114, 1304 . . . Antenna terminal
C . . . Capacitor element
D . . . Diode
G . . . Ground electrode
L . . . Inductor element
R . . . Resistor element
TL . . . Transmission line
V . . . Via electrode
300, 400 . . . Laminated component
400A, 400B, 400C, 400D . . . Dielectric sheet

DETAILED DESCRIPTION OF THE PREFERRED EMBODIMENTS

Embodiment 1

Figure 1:
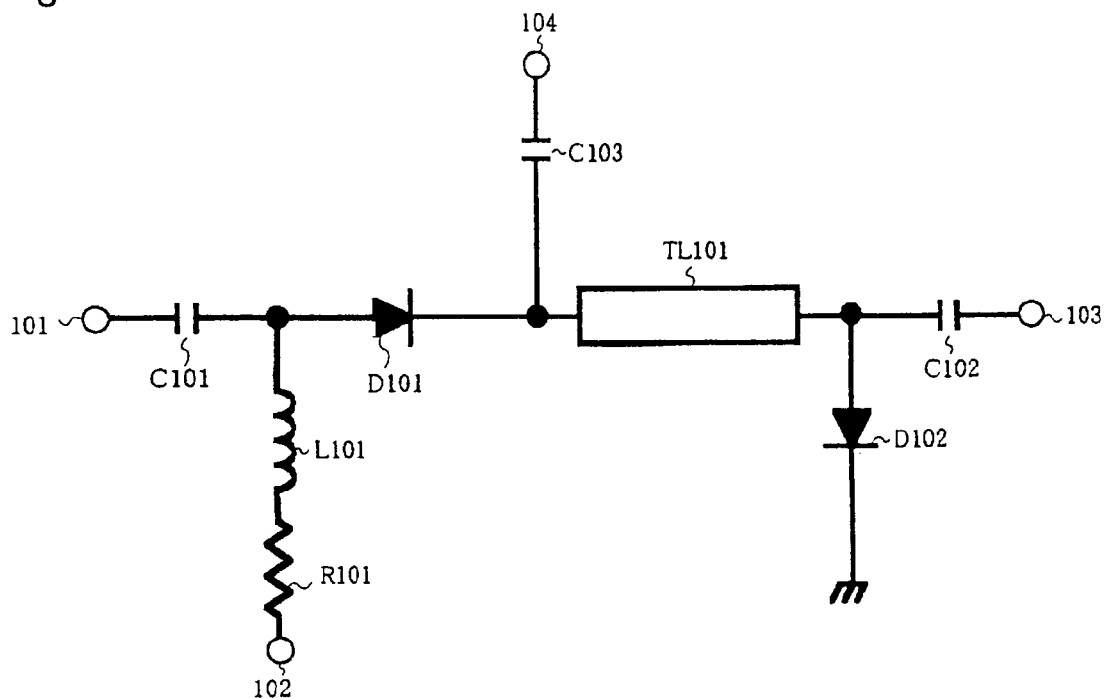
FIG. 1 shows a circuit diagram of a high frequency switch circuit according to an embodiment 1 of the present invention.

Hereinafter, a high frequency switch circuit according to the embodiment 1 of the present invention will be described with reference to a circuit for use in switching of an antenna, which is often used to carry out communication in TDMA systems. FIG. 1 shows an equivalent circuit of a high frequency switch circuit according to the embodiment 1. In FIG. 1, an anode of a first diode D101 is coupled to a transmitting terminal 101 through a first capacitor C101. Further, a control terminal 102 is coupled to an anode side of the first diode D101 through an inductor element L101 and a resistor element R101. An anode of a second diode D102 is coupled to a receiving terminal 103 through a second capacitor element C102, and a cathode of the second diode is connected to ground.

One end of a transmission line TL101 having an electrical length of ¼ wavelength at an operating frequency is connected also to the anode side of the second diode D102, and the other end of the transmission line is connected to the cathode of the first diode D101 and also coupled to the antenna terminal 104 through a third capacitor element C103. Herein, an ON resistance of the first diode D101 is lower than that of the second diode D102, and the capacitance of the second diode D102 in the OFF state is smaller than that of the first diode D101 in the OFF state.

The operation of the high frequency switch circuit configured as described above will be described.

In the case of transmitting, when a positive voltage is applied to a control terminal 102, the first diode D101 and the second diode D102 are turned on. At this time, the capacitance elements C101, C102, and C103 block components of direct current and thus no current flows to the respective terminals. Also, the inductor element L101 is used as a high frequency choke to prevent a high frequency current from flowing to the control terminal 102. Also, the resistance element R101 is used to feed a bias current through the diode D101 and D102.

A transmit signal transmitted from the transmitting terminal 101 passes through the capacitor element C101 and the first diode D101 and then is transmitted to the antenna terminal 104 through the capacitor element C103. At this time, the transmission line TL101 acts as a one-end-grounded resonator, because the second diode D101 is turned on so as to ground the transmission line TL101. Therefore, the impedance of the transmission line on the side of the antenna is nearly infinite to isolate the receiving side at high frequencies, thereby the transmit signal being not transmitted to the receiving side. Because a diode of low ON resistance is used for the first diode D101, the signal line carrying the transmit signal is made a path of low loss.

Next, in the case of receiving, no voltage is applied to the control terminal 102 and therefore the first diode D101 and the second diode D102 are in the OFF state. A receive signal passes through the capacitor element C103 from the antenna terminal 104, and then is transmitted to the receiving terminal 103 through the transmission line TL101 and the capacitor element C102. Herein, because a diode having a small inter-terminal capacitance in the OFF state is used for the second diode D102, the second diode can offer a high degree of isolation, thereby causing the receive signal to be transmitted to the receiving terminal 103 without leakage to the ground side, to which the second diode D102 is connected. Therefore, the signal path carrying the receive signal is made a path of low loss.

Figure 2:
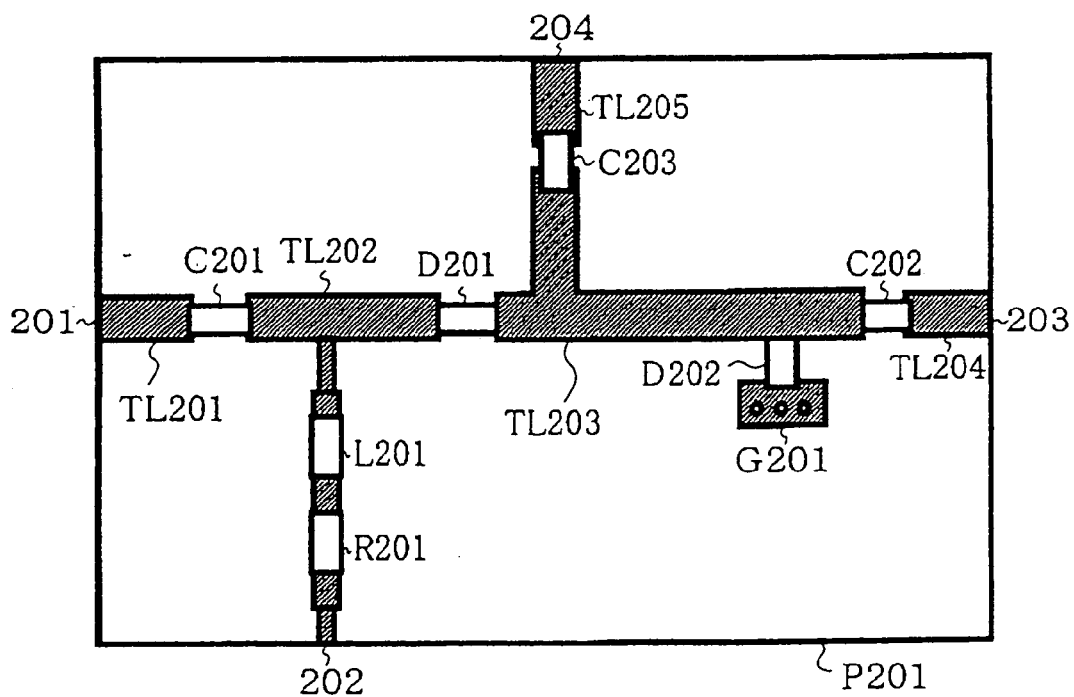
FIG. 2 shows a mounting diagram of the embodiment 1 of the present invention.

FIG. 2 is a top view of an example of a printed circuit board having the circuit of FIG. 1 formed thereon. A printed circuit board P201 is made of a glass fabric based epoxy resin or the like, and provided with a ground electrode on the back side thereof not shown. Transmission lines TL201 to TL205 are micro-strip lines formed on the printed circuit board P201. An inductor element L201 realized with an air core coil, capacitor elements C201 to C203 realized with chip capacitors or the like, a resistor element R201 realized with a chip resistor or the like, a first diode D201, and a second diode D202 all are mounted on the printed circuit board P201 by soldering or the like. Reference character G201 denotes an electrode provided for grounding the cathode side of the second diode D202, and the electrode is electrically connected through a through-hole to the ground electrode on the back side of the printed circuit board P201. The printed circuit board P201 is provided with a transmitting terminal 201, a control terminal 202, a receiving terminal 203, and an antenna terminal 204.

As described above, in the present embodiment, a diode of low ON resistance is used for the diode on the transmitting side, and a diode having a small inter-terminal capacitance in the OFF state is used for the diode on the receiving side. As a result, in either case of transmitting and receiving, the signal path carrying a transmit signal or a receive signal can realize a high frequency switch circuit of low loss.

Embodiment 2

Figure 3:
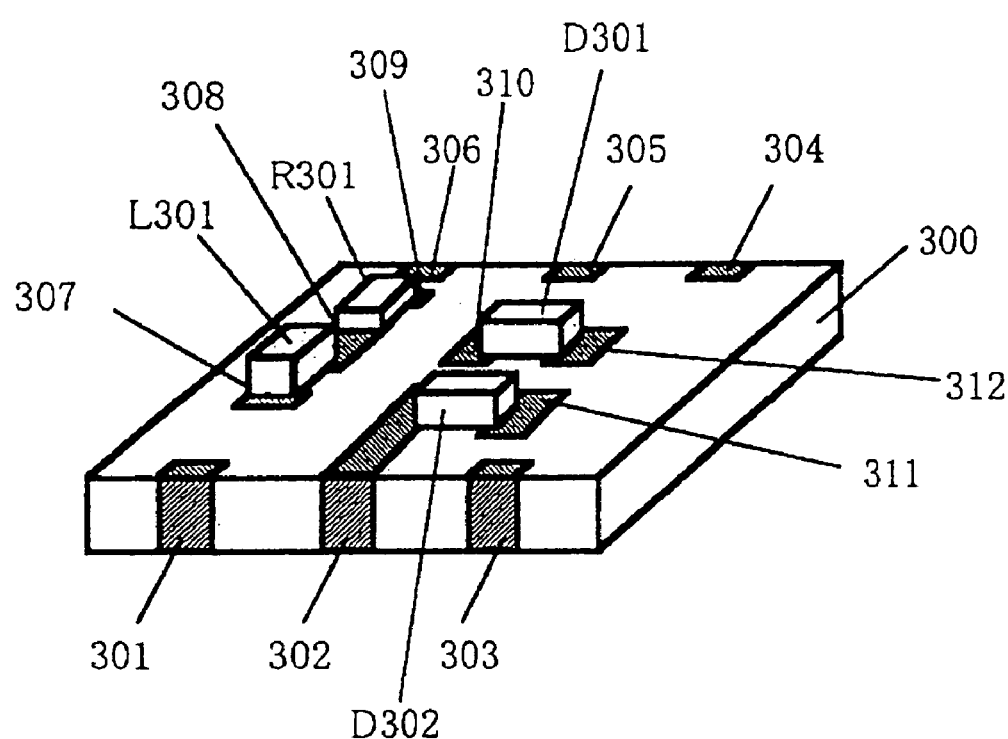
FIG. 3 shows a perspective diagram of a lamination type of high frequency switch according to an embodiment 2 of the present invention.
Figure 4:
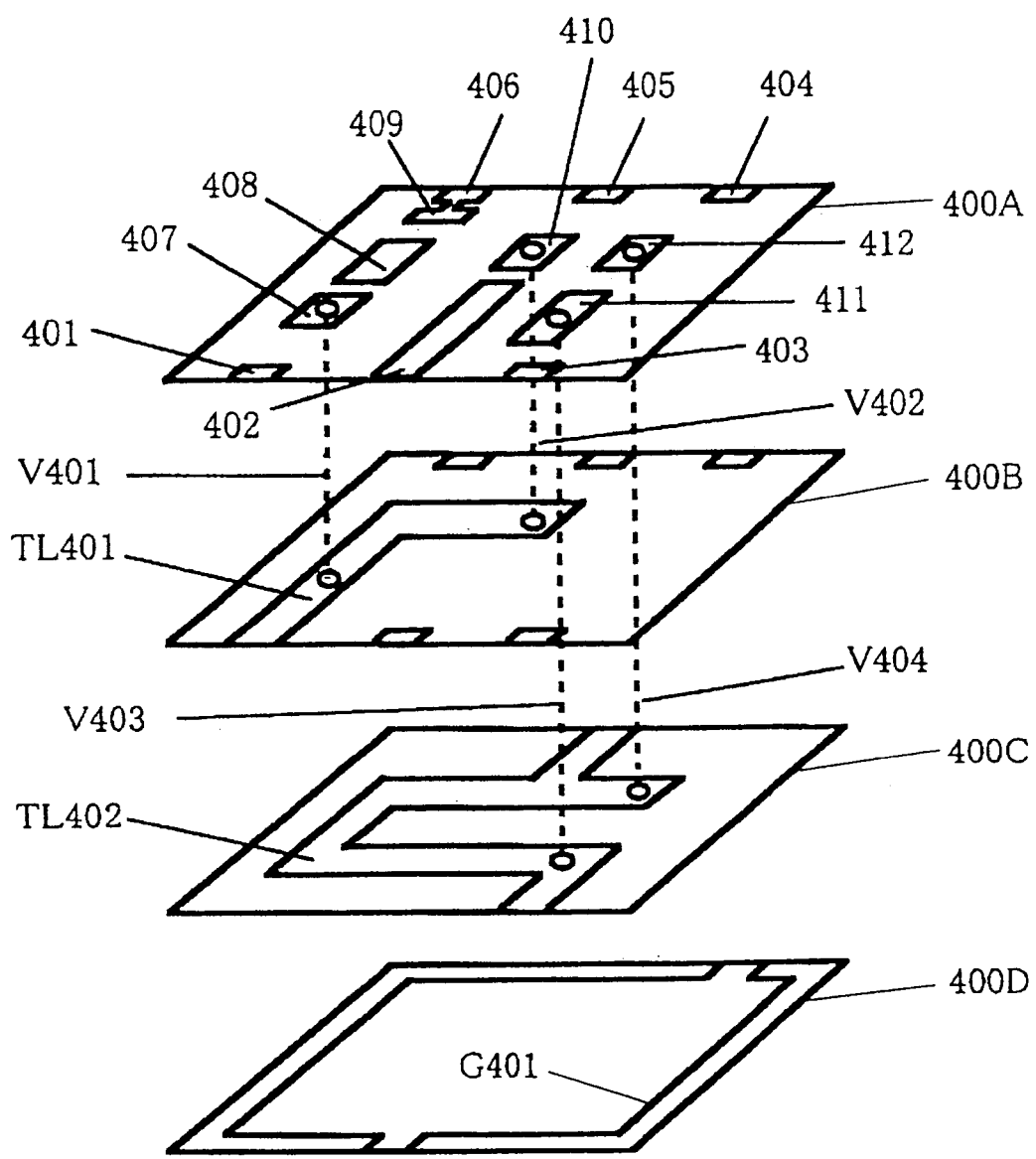
FIG. 4 shows an exploded perspective diagram of the lamination type of high frequency switch according to the embodiment 2 of the present invention.
Figure 5:
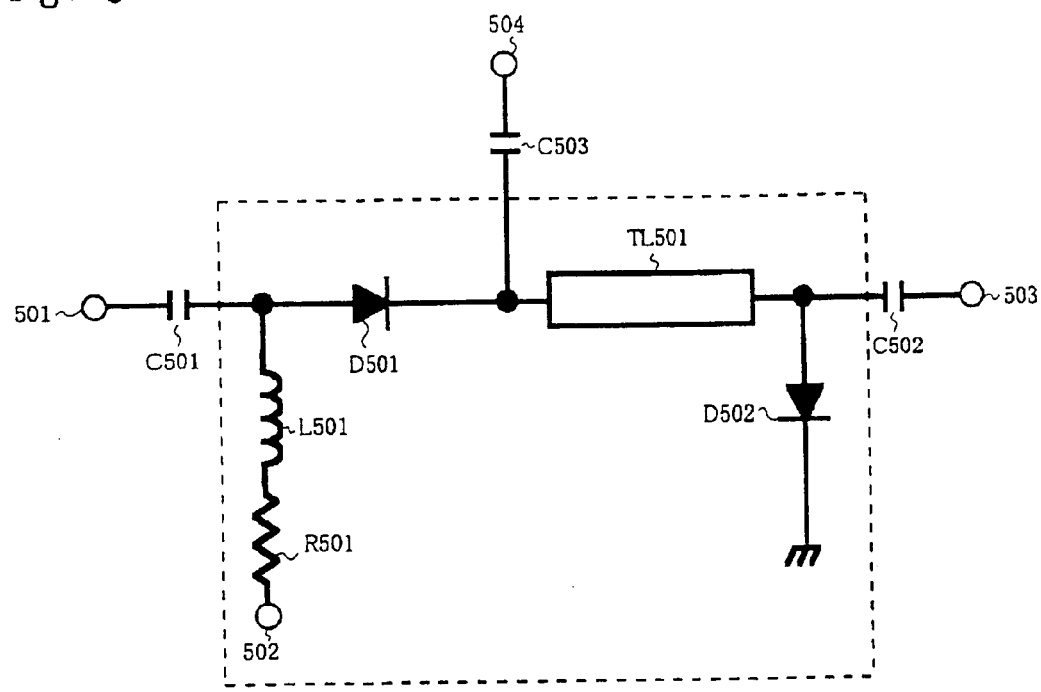
FIG. 5 shows a circuit diagram of the embodiment 2 of the present invention.

Next, an embodiment 2 of the present invention will be described with reference to drawings. FIGS. 3, 4 and 5 are respectively a perspective view, an exploded perspective view and a circuit diagram of a laminated component configuring a high frequency switch circuit according to the embodiment 2 of the present invention. In FIG. 3, terminal electrodes for a transmitting terminal 301, an ground terminal 302, a receiving terminal 303, an ground terminal 304, an antenna terminal 305, and a control terminal 306 are provided on the sides and on the top and bottom surfaces, near to the sides, of the laminated component 300 having a plurality of dielectric sheets laminated therein. Electrodes 307, 308, 309, 310, 311, and 312 are electrodes provided on the surface of the laminated component 300.

A first diode D301 and a second diode D302 are respectively connected to the electrodes 310 and 312 and to the electrodes 302 and 311 by soldering or the like. In the same manner, an inductor element L301 and a resistor element R301 are connected to the electrodes 307 and 308 and to the electrodes 308 and 309, respectively.

FIG. 4 is an exploded perspective view of the high frequency switch of FIG. 3. Terminal electrodes for a transmitting terminal 401, a ground terminal 402, a receiving terminal 403, a ground terminal 404, an antenna terminal 405, and a control terminal 406 are provided on the sides and on the top and bottom surfaces, near to the sides, of dielectric sheets 400A, 400B, 400C, and 400D. Electrode patterns 407, 408, 409, 410, 411, and 412 are provided on the top surface of the dielectric sheet 400A. A transmission line TL401 extending from the transmitting terminal 401 is provided on the dielectric sheet 400B, and electrically connected to the electrode pattern 407 through a via V401, which is used for supplying a control voltage. The transmission line TL401 is also connected to the electrode pattern 410 through a via 402.

The sheet TL402 provided on the dielectric sheet 400C extends from the antenna 405 to the receiving terminal 403 and is further electrically connected to the electrode patterns 411 and 412 through vias V403 and V404, respectively. A ground electrode G401 provided on the sheet 400D is grounded through the ground terminal 402 and the control terminal 406.

An example of the configuration of the laminated component shown in FIG. 4 comprises circuit elements enclosed in the dotted line shown in the circuit diagram of FIG. 5. Further, capacitor elements C501, C502 and C503 for blocking direct currents are provided on a wiring board equipped with this laminated component, thus configuring a high frequency switch circuit module.

By the way, in the embodiment shown in FIG. 3, the resistor R301 and inductor element L301 have been described as discrete components mounted on the surface of the laminated component 300. However, the laminated component 300 can contain the resistor element and the inductor element as a printed resistor and as a transmission line of high impedance, respectively, thereby providing the same advantages.

Further, in FIG. 5, although the capacitor elements C501, C502, and C503 are respectively provided for the transmitting terminal 501, receiving terminal 503, and antenna terminal 504 as external elements of the laminated component 300, these elements can be also contained in the laminated component 300, providing the same advantages. In such manners, by making the laminated component contain each element configuring the high frequency switch, the switch can be made smaller, and further more reliable.

Embodiment 3

Figure 6:
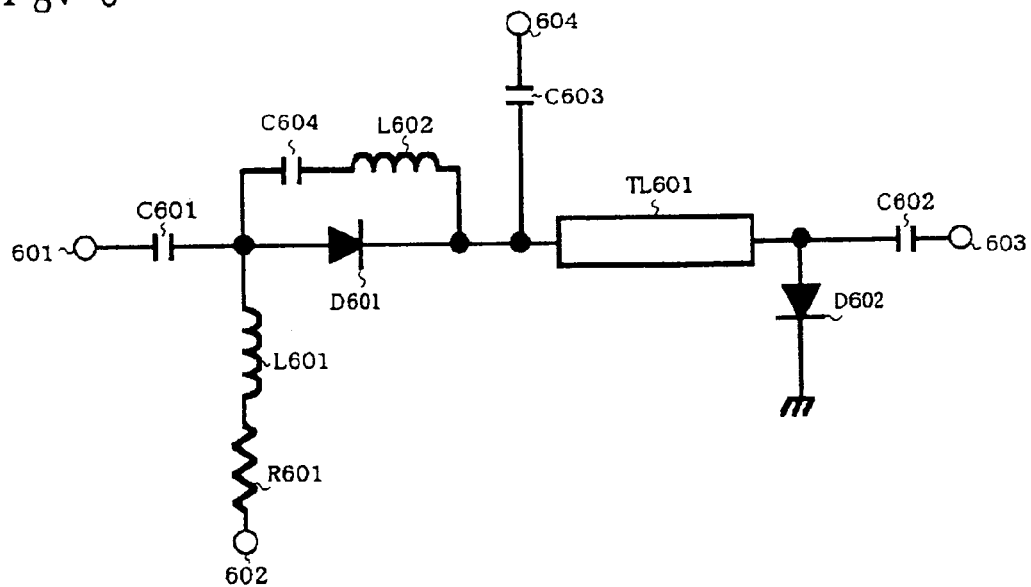
FIG. 6 shows a circuit diagram of an embodiment 3 of the present invention.

Next, an embodiment 3 of the present invention will be described with reference to a drawing. FIG. 6 shows an equivalent circuit of a high frequency switch circuit according to the embodiment 3 of the present invention. A difference from the embodiment 1 is in that a series circuit of a capacitor element C604 and an inductor element L602 is provided in parallel with a first diode D601. This is for increasing the isolation between an antenna terminal 604 and a transmitting terminal 601 during receiving by using the inter-terminal capacitance of the first diode D601 in the OFF state and the inductor element L602.

Herein, the capacitor element 604 is provided in order to block a component of direct current from a control terminal 602, and has such a large value of capacitance as to avoid resonance in the frequency band to be used by the first diode in the ON state.

Thereby, the high frequency switch circuit according to the embodiment can realize a reduction in loss produced in the path of transmit signals during transmitting, and also realize an increased isolation of the signal path on the transmitting side during receiving, thus providing a higher-performance switch circuit.

By the way, although the above embodiment has been described as being provided with the series circuit of the capacitor element C604 and the inductor element L602, a single inductor element may be used instead of the series circuit.

Embodiment 4

Figure 7:
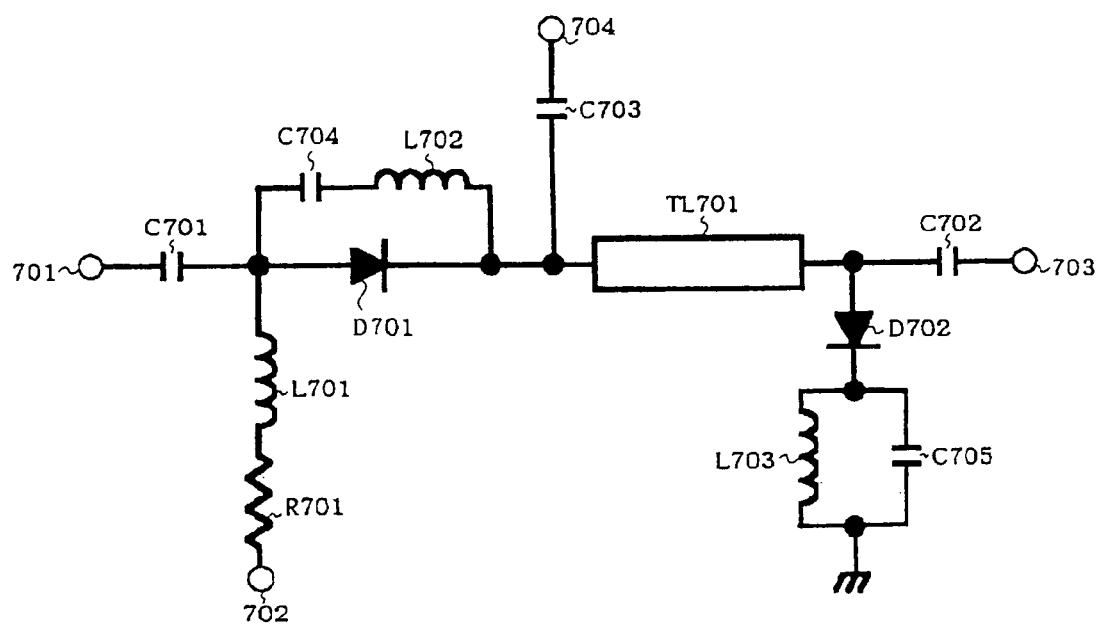
FIG. 7 shows a circuit diagram of an embodiment 4 of the present invention.

Next, an embodiment 4 of the present invention will be described with reference to drawings. FIG. 7 shows an equivalent circuit diagram of a high frequency switch circuit according to the embodiment 4 of the present invention. A difference from the embodiment 3 is in that a parallel circuit of an inductor element L703 and a capacitor element C705 is provided in series with a second diode D702, in addition to the embodiment 3. This parallel circuit is provided for the purpose of reducing the grounding resistance during transmitting by establishing series resonance between an inter-terminal inductor component of the second diode D702 in the ON state and the capacitor element C705.

Thereby, the embodiment provides a high frequency switch circuit in which the signal path during transmitting has lower loss and higher isolation than the embodiment 3.

Figure 8:
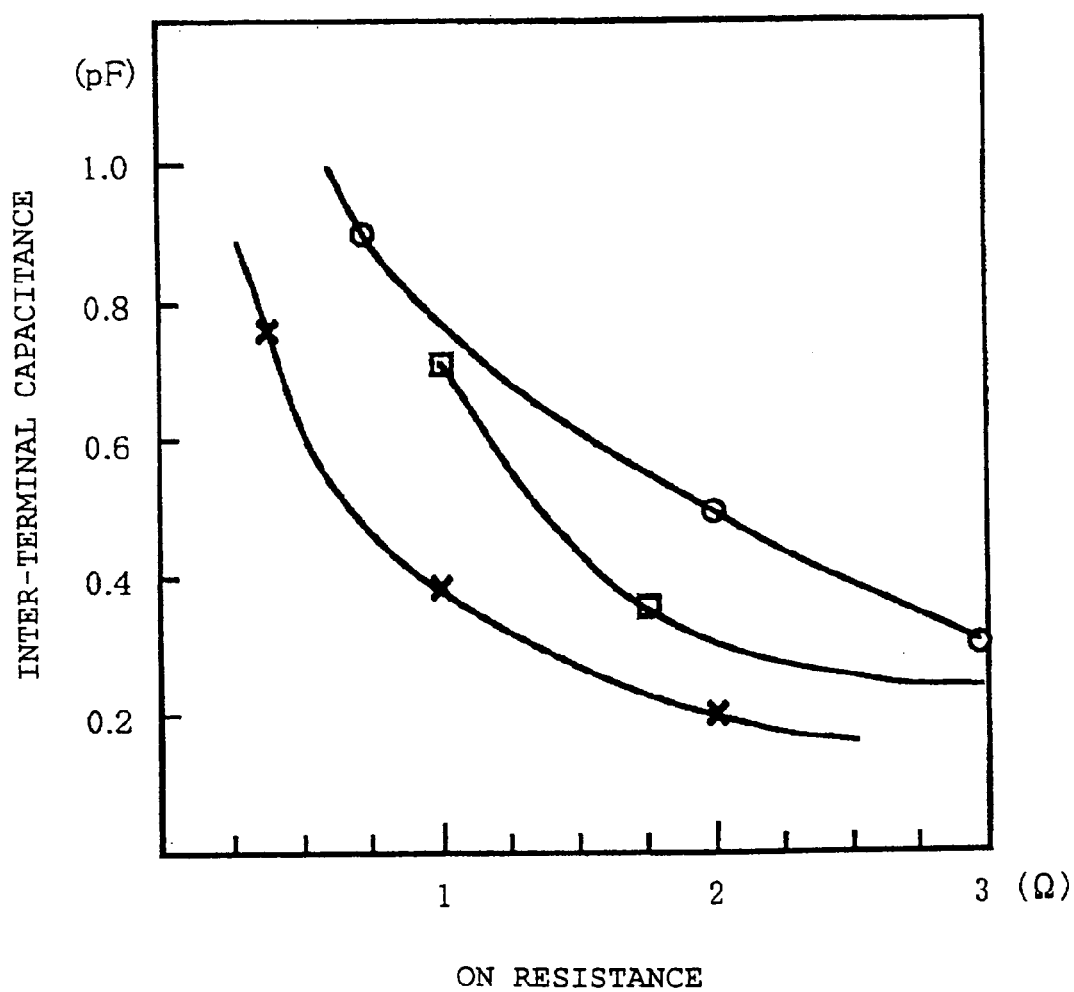
FIG. 8 shows examples of the characteristics of PIN diodes.

FIG. 8 shows an example of the characteristics showing the relationship between the ON resistance and the inter-terminal capacitance of PIN diodes. As shown in this figure, a PIN diode of lower ON resistance has a larger inter-terminal capacitance, and a PIN diode of smaller inter-terminal capacitance has a higher ON resistance. The first diode preferably has an ON resistance of not higher than 1 Ω, more preferably not higher than 0.8 Ω. Also, the second diode in the OFF state has an inter-terminal capacitance of not higher than 0.8 pF, more preferably not higher than 0.5 pF. Further, this relationship between the first diode and the second diode is also the same for the embodiments 1 to 3.

Further, the above embodiments has been described as being provided with the parallel circuit of the capacitor element C705 and the inductor element L703, but a single capacitor element may be used instead of the parallel circuit.

Also, the above embodiment has been described as the addition of the parallel circuit of the capacitor element C705 and the inductor element L703 to the configuration of the embodiment 3, but the parallel circuit may be added to the configuration of the embodiment 1.

Embodiment 5

Figure 9:
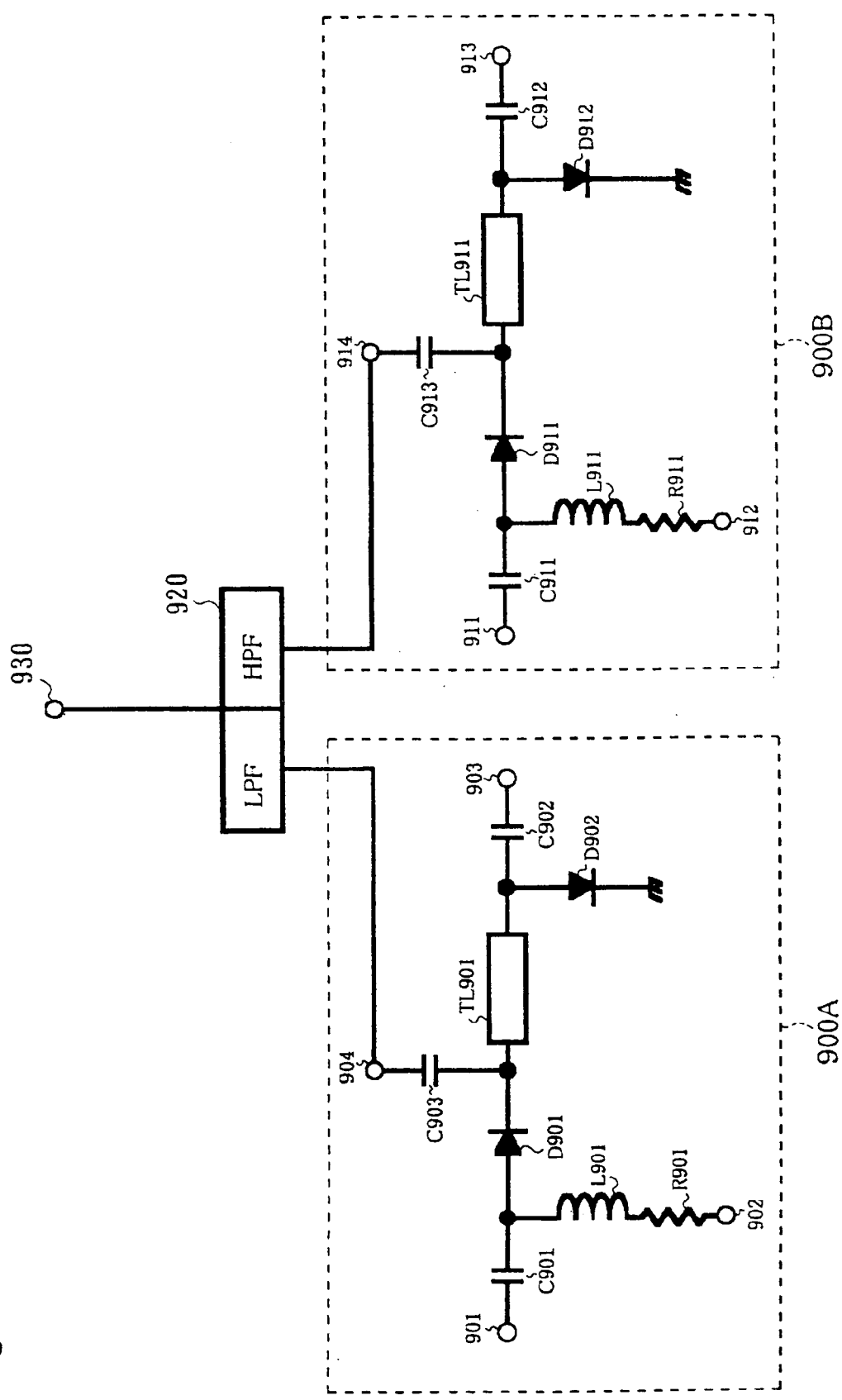
FIG. 9 shows a circuit diagram of an embodiment 5 of the present invention.

FIG. 9 shows the equivalent circuit diagram of a two-band type of high frequency switch circuit implementing the high frequency switch circuit according to the present invention.

The two-band type of high frequency switch circuit according to this embodiment has the two switches of a first high frequency switch 900A for use in a first frequency band f1 and a second high frequency switch 900B for use in a second frequency band f2 higher than the first frequency band. Further, respective antenna terminals 904 and 914 for each of the high frequency switches are combined together in a diplexer 920 so as to be coupled to an antenna terminal 930. Thus, the two high frequency switches share the same antenna, which is connected to the antenna terminal 930, not shown.

Figure 10:
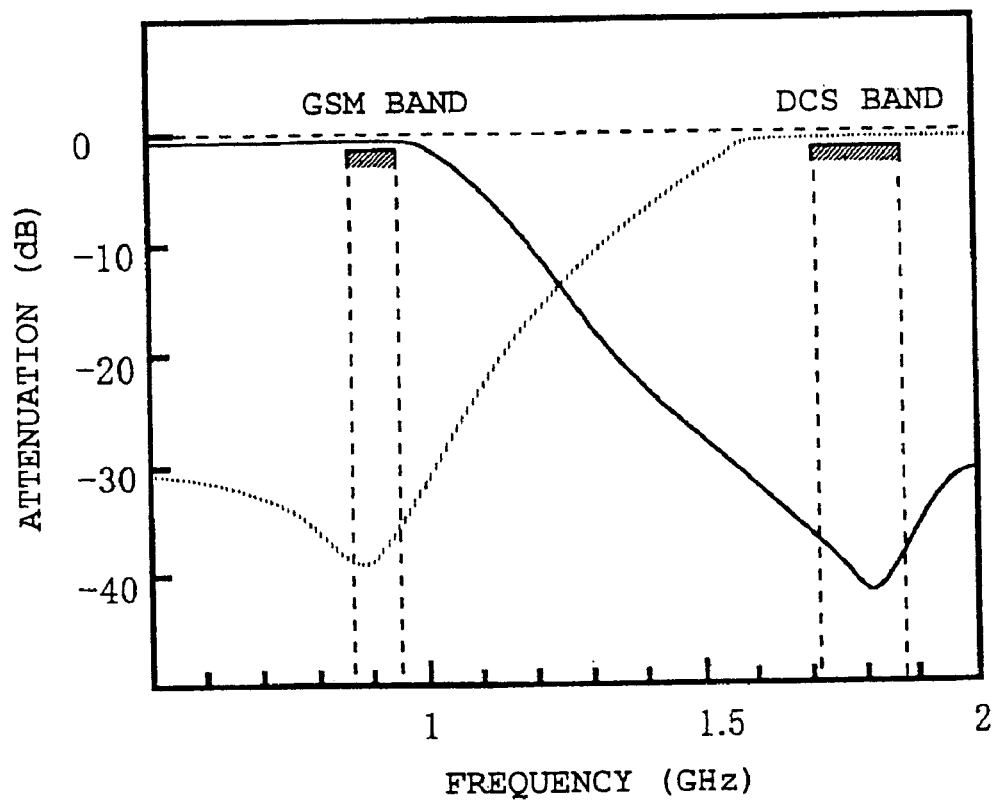
FIG. 10 shows an example of the transmission characteristics of a divider.

Hereinafter, the two-band type of high frequency switch according to the embodiment 5 of the present invention will be described taking GSM and DCS systems used in mobile communication in Europe as specific examples. Herein, f1 is assumed to be a band of 880 to 960 MHz, which is the frequency band for transmitting/receiving in the GSM system, and f2 is assumed to be a band of 1710 to 1880 MHz, which is the frequency band for transmitting/receiving in the DCS system. Further, herein, the following description will use an example of the diplexer 920 which is configured with a low pass filter and a high pass filter each having the respective characteristics as shown in FIG. 10. In addition to this, the diplexer 920 may be also configured by combining two kinds of band pass filters each having different pass bands.

In transmitting, applying a voltage to a control terminal 902 of the first high frequency switch 900A turns on diodes D901 and D902, and therefore a transmit signal of the GSM band passes through a capacitor element C901, a diode D901, and a capacitor element C903 from a transmitting terminal 901, then inputting to a terminal 904 on the side of a low pass filter (LPF) of the diplexer 920.

Applying a voltage to a control terminal 912 of the second high frequency switch 900B turns on diodes D911 and 912, and therefore a transmit signal of the DCS band passes through a capacitor element C911, a diode D911, and a capacitor element C913 from a transmitting terminal 911, then inputting to a terminal 914 on the side of a high pass filter (HPF) of the diplexer 920. Each of the transmit signals input to the diplexer 920 is output to the antenna terminal 930 without being output to another side of the high frequency switches, because isolation is provided in the cross band as shown in FIG. 9.

In receiving, when the control terminal is turned off, a signal received at the antenna is input from the antenna terminal 930 to the diplexer 920. Then, the signal is output to the antenna terminal 904 of the LPF side if the signal is of the GSM band and to the antenna terminal 914 of the HPF side if the signal is of the DCS band by the diplexer 920, respectively.

A signal of the GSM band passes through the capacitor element C903, a transmission line TL901, and a capacitor element C902 from the antenna terminal 904, and then is output to a receiving terminal 903 for the GSM band. Further, a signal of the DCS band passes through the capacitor element C913, a transmission line TL911, and a capacitor element C912 from the antenna terminal 914, and then is output to a receiving terminal 913 for the DCS band.

In such a configuration, in both of the first high frequency switch 900A and the second high frequency switch 900B, the first diodes D901 and D911 placed on the side of the transmitting terminals 901 and 911 are provided with lower ON resistance than the second diodes D902 and D12 placed on the side of the receiving terminals 903 and 913. Further, the diodes D902 and D912 placed on the side of the receiving terminals 903 and 913 are provided with smaller inter-terminal capacitance in the OFF state than the diodes D901 and D911 placed on the side of the transmitting terminals. As a result, the embodiment provides the same low-loss high frequency switch as in the case of the embodiment 1, that is, the two-band high frequency switch of low loss is provided. In this case, preferably, the ON resistance of the diode D901 is not higher than 1Ω, and that of the diode D911 is not higher than 0.8Ω, and also the inter-terminal capacitance of the diode D902 is not larger than 0.8 pF, and that of the diode D912 is not larger than 0.5 pF.

The configuration as described above realizes, in the lower frequency side, an increase in isolation during receiving, thus reducing leakage signals to the transmitting-terminal side, though a little large loss is produced on the transmitting side. Further, because high frequency switches is generally desired to be lower in loss in the higher frequency side during transmitting, the ON resistance is made small. By using such two-band type of high frequency switch, it is possible to reduce power consumption of radio communication equipment.

Further, the diplexer 930 used in this configuration permits various operations according to requirements of communication systems, such as transmitting and receiving of two waves, or receiving during transmitting at one side.

Embodiment 6

Figure 11:
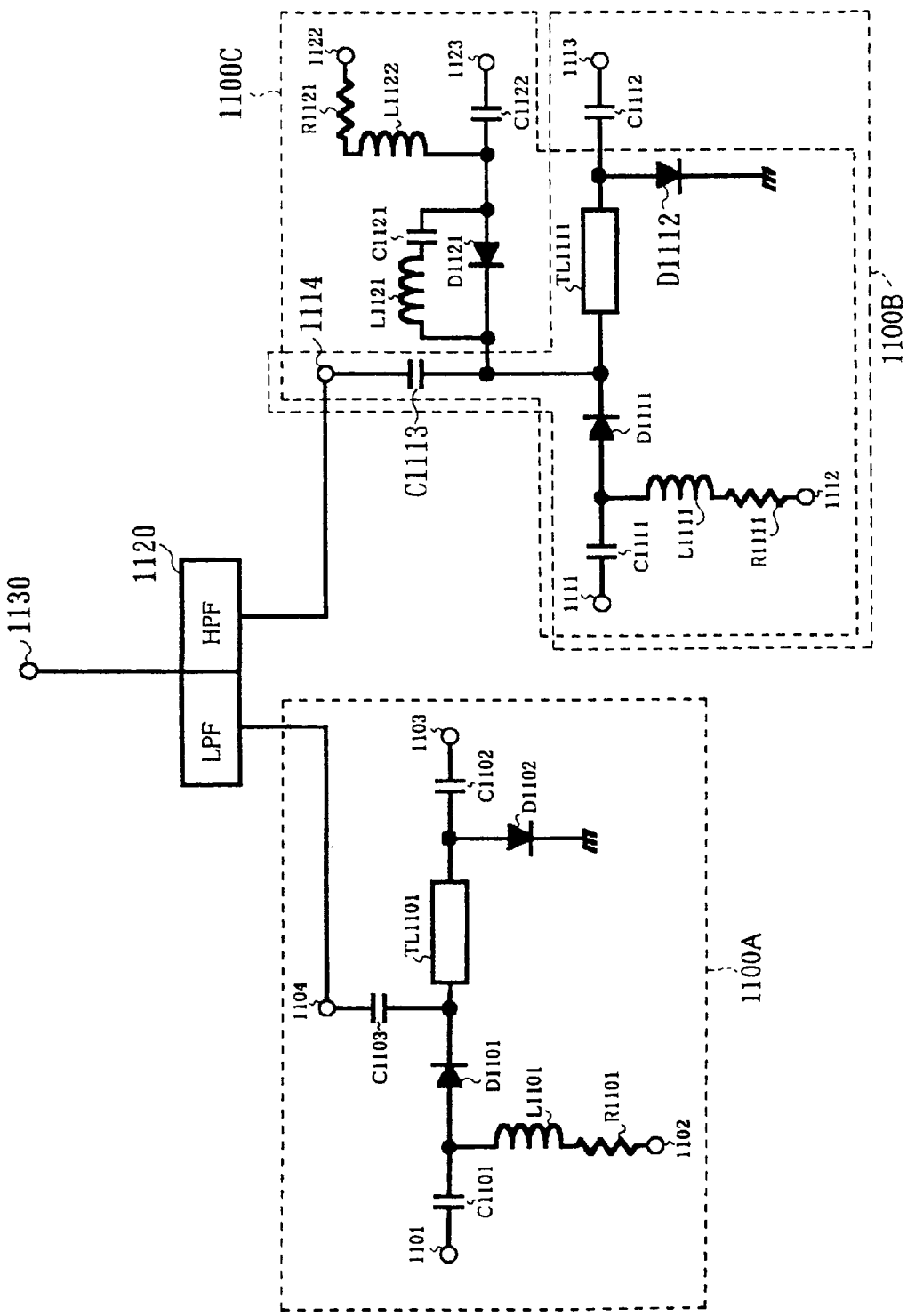
FIG. 11 shows a circuit diagram of an embodiment 6 of the present invention.

FIG. 11 shows a three-band type of high frequency switch circuit implementing the high frequency switch circuit according to the present invention. The three-band type of high frequency switch circuit according to the embodiment has the three switches of a first high frequency switch 1100A for use in a first frequency band f1, a second high frequency switch 1100B for use in a second frequency band f2 higher than the first frequency band, and a third high frequency switch 1100C for use in a third frequency band f3 higher than the first frequency band. Further, respective antenna terminals 1104 and 1114 of each high frequency switch are combined together in a diplexer so as to be coupled to an antenna terminal 1130. Thus, the three high frequency switches share the same antenna not shown.

Further, the first high frequency switch 1100A and the second high frequency switch 1100B respectively have the same configuration as the high frequency switch of the embodiment 1.

Further, the third high frequency switch 1100C shares, as the configuration of the transmitting side thereof, a transmitting terminal 1111, a capacitor element C1111, an inductor element L1111, a resistor element R1111, a control terminal 1112, and a first diode D1111 with the second high frequency switch 1100B. The third high frequency switch 1110C also shares an antenna terminal 1114 forming a signal path for both a transmit signal and a receive signal, and a capacitor element C1113 with the second high frequency switch 1100B. The third high frequency switch 1100C further shares, as a part of the configuration of the receiving side thereof, a transmission line TL1111 and a second diode D1112 with the second high frequency switch 1110B.

Further, the receiving side of the third high frequency switch 1100C comprises a third diode D1121 having an anode connected between a capacitor element D1113 and a node of the first diode D1111 and the transmission line TL1111 and having a cathode coupled to a receiving terminal 1123 through a capacitor element C1122, a control terminal 1122 coupled to a node of the anode of the third diode D121 and the capacitor element C1122 through a series circuit of a resistor element R1121 and an inductor element L1122, and a series circuit of a capacitor element C1121 and an inductor element L1121, which series circuit is connected in parallel with the third diode D1121.

That is, the third high frequency switch has a receiving circuit having the third diode D1121 and a peripheral circuit, a transmitting circuit has the first diode D1111 and a peripheral circuit and a switching circuit having the second diode D1112 and the transmission line TL1111. Furthermore, the transmission circuit is shared with the second circuit 1100B in flowing of high frequency signal and the switching circuit is shared with the second circuit 1100B in flowing of direct current.

Hereinafter, the three-band type of high frequency switch according to an embodiment 6 of the present invention will be described taking GSM and DCS systems used in mobile communication in Europe and PCS systems used in USA as specific examples. Herein, f1 is assumed to be a band of 880 to 960 MHz, which is the frequency band for transmitting/receiving in the GSM system, f2 is assumed to be a band of 1711 to 1880 MHz, which is the frequency band for transmitting/receiving in the DSC system, and f3 is assumed to be a band of 1860 to 1990, which is the frequency band for transmitting/receiving in the PCS system.

In transmitting, applying a voltage to a control terminal 1102 of the first high frequency switch 1100A turns on a first diode D1011 and a second diode D1102, and therefore a transmit signal of the GSM band input to a transmitting terminal 1101 is supplied through a capacitor element C1101, the first diode D1101, and a capacitor element C1103 to an antenna terminal 1104 on the side of a low pass filter (LPF) of the divider 1120.

Applying a voltage to a control terminal 1112 of the second high frequency switch 1100B (the third high frequency switch 1100C) turns on diodes D111 and D1112, and therefore transmit signals of the DCS band and PCS band are supplied from a transmitting terminal 1111 to the terminal 1114 of a high pass filter (HPF) of the divider 1130 through the capacitor element C1111, the first diode D1111, and the capacitor element C1113.

Because the divider 1120 is provided with isolation in the cross band as shown in FIG. 9 referred to in the embodiment 5, each transmit signal input to the divider 1120 is output to the antenna terminal 1130 without being output to the side of the different high frequency switch.

In receiving, when the control terminals 1102, 1112 and 1122, are turned off, a signal of the GSM band received at the antenna and input from the antenna terminal 1130 to the divider 1120 is output to the antenna terminal 1104 of the LPF side by the divider 1120. Also, in the same manner, signals of the DCS and PCS bands are output to the antenna terminal 1114 of the HPF side.

A signal of the GSM band passes through the capacitor element C1103, a transmission line TL1101, and a capacitor element C1102 from the antenna terminal 1104, and then is output to a receiving terminal 1103 for the GSM band.

Also, a signal of the DCS band passes through a capacitor element C1113, a transmission line TL1111, and a capacitor element C1112 from the terminal 1114, and then is output to a receiving terminal 1113 for the DCS band.

Further, in the receiving of a signal of the PCS band, when a voltage is applied to the control terminal 1122, the third diode D1121 and the second diode D1112 are turned on for an operation of the third high frequency switch 1100C. Thus, a receive signal of the PCS band is output from the antenna terminal 1114 to the receiving terminal 1123 for the PCS band through the capacitor element C1113, the third diode D1121, and the capacitor element C1122.

Further, when the third diode D1121 is turned off, that is, when the third diode D1121 operates as part of the second high frequency switch 1110B to receive a DCS band signal, the inter-terminal capacitance of the third diode D1121 and the inductor element L1121 produce a parallel resonance, thereby ensuring isolation between the DCS band and PCS band so as to prevent the signal of the DCS band from flowing to the side of the receiving terminal 1123 for the PCS.

In such a configuration, the first diodes D1101 and D1111 each placed on the side of the receiving terminals 1101 and 1111 and the third diode D1121 for use in receiving signals of the PCS band are provided with lower On resistance than the second diodes D1102 and D1112 each placed on the side of the receiving terminals 1103 and 1113. Further, the second diodes D1102 and D1112 placed on the side of the receiving terminals 1103 and 1113 are provided with smaller inter-terminal capacitance in the OFF state than the diodes D1101 and D1111 placed on the side of the transmitting terminals 1101 and 1111. As a result, this configuration provides a low-loss high frequency switch.

Further, the diodes used in the second high frequency switch 1100B and the third high frequency switch 1100C, which operate on the side of higher frequency, are desirably selected to make the switches lower in loss than the first high frequency switch 1100A operating on the side of lower frequency. Further, the ON resistance of the third diode D1121 is desirably lower than the ON resistance of the first diode D1101 on the side of the transmitting terminal 1101 in the first high frequency switch 1100A.

For example, in this case, desirably, the ON resistance of the first diode D1101 is not higher than 1Ω, the ON resistance of the first diode D1111 is not higher than 0.8Ω, the ON resistance of the third diode D1121 is not higher than 0.5Ω, and the inter-terminal capacitance of the second diodes D1102 and D1112 in the OFF state each are not higher than 0.8 pF.

By using the three-band type of high frequency switch having the above configuration, a diode of low ON resistance is used for receiving signals of the PCS system, thus permitting low loss, and the inductor element connected in parallel with the diode D1121 permits sufficient isolation.

Further, in the other circuit portions of the above configuration, the characteristics of the same low-loss and high isolation as the two-band type of high frequency switch are obtained. Using the three-band type of high frequency switch having such a configuration permits a reduction in power consumption of radio communication equipment because of the reduced loss of the transmitting side. Further, the divider used in the configuration permits independent operations such as transmitting and receiving at the same time on the side of GSM and the side of DCS and PCS as in the case of the two-band type of high frequency switch. Furthermore, making up the above configuration into a laminated structure can realize a smaller three-band type high frequency switch, and thus permits smaller radio communication equipment.

Embodiment 7

Figure 12:
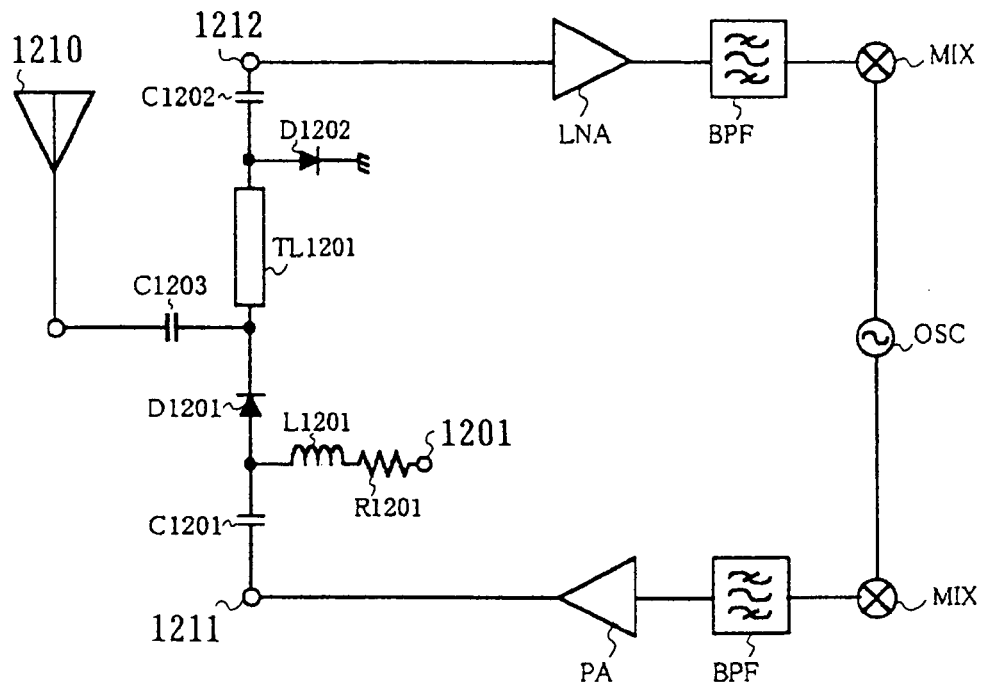
FIG. 12 shows a block circuit diagram of radio communication equipment implementing the high frequency switch circuit according to the present invention.
Figure 13:
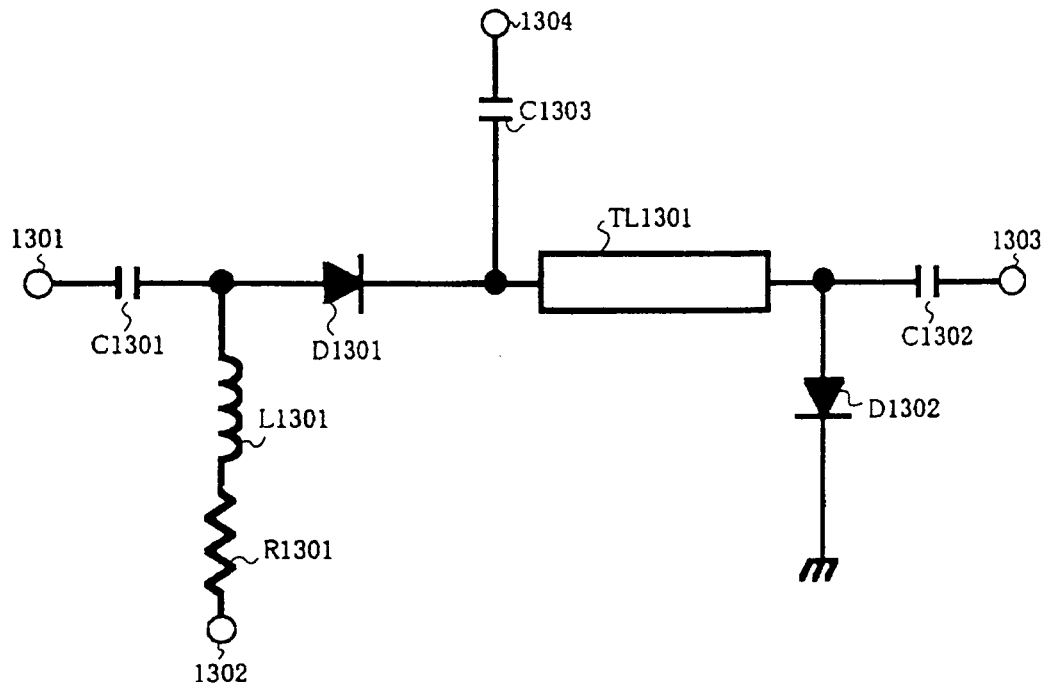
FIG. 13 shows a circuit diagram of an example of a conventional high frequency switch circuit.

FIG. 12 shows a block diagram of the radio portion of radio communication equipment mounting the high frequency switch circuit according to the present invention. When a voltage is applied to a control terminal 1201, a first diode D1201 and a second diode D1202 are turned on, and therefore a transmit signal from a power amplifier PA passes through a capacitor element C1201, a diode element D1201, and a capacitor element C1203 from a transmitting terminal 1211, and then is transmitted from an antenna 1210. Herein, the power amplifier PA configures the means of the present invention along with an oscillator OSC, a mixer MIX, and a band pass filter BPF.

Also, when a voltage is not applied to the control terminal 1201, the first diode D1201 and the second diode D1202 are turned off, and therefore a receive signal from the antenna 1210 passes through the capacitor element 1203, a transmission line TL1201, and a capacitor element C1201, and inputs to a low noise amplifier LNA via a receiving terminal 1212. Herein, the low noise amplifier LNA configures receiving means of the present invention along with the oscillator OSC, a mixer MIX, and a band pass filter BPF on the receiving side.

In transmitting, because of the low ON resistance of the first diode D1201, the transmit signal from the power amplifier PA can be transmitted with a little loss. Further, the transmit signal is not transmitted to the receiving terminal because one end of the transmission line TL1201 is grounded. In receiving, because the second diode D1202 has a small inter-terminal capacitance in the OFF state, a receive signal can be transmitted to the low noise amplifier LNA without attenuation.

In the embodiment 2, although the circuit of the embodiment 1 has been realized in the laminated component, the circuits of the embodiments 3, 4, 5, and 6 can be also realized in the laminated component. Further, the transmission lines in the laminated component have been formed in one layer, but a multi-structure having 2 or more layers of transmission lines can provide the same advantages.

As described above, the present invention can provide a high frequency switch of low-loss and high isolation. Further, a laminated structure of the high frequency switch can be used to make the switch smaller and higher reliable, thereby permitting smaller size and reduced power-consumption of radio communication equipment.

What is claimed is:

1. A three-band type of high frequency switch, comprising:
   a first high frequency switch for use in a first frequency band;
   a second high frequency switch for use in a second frequency band higher than the first frequency band;
   a third high frequency switch for use in a third frequency band higher than the first frequency band;
   a divider for sharing a same antenna among said first high frequency switch, said second high frequency switch, and said third high frequency switch, by multiplexing and demultiplexing said first frequency band, said second frequency band and said third frequency band, the antenna terminal of said first high frequency switch and an antenna terminal of said second high frequency switch being electrically connected to each other,
   wherein said first high frequency switch and said second high frequency switch each comprises a transmitting terminal, a receiving terminal, an antenna terminal, a first diode having an anode electrically connected to said transmitting terminal and a cathode electrically connected to said antenna termInal, a second diode having an anode connected through a transmission line of ¼ wavelength to the antenna terminal which is electrically connected to said receiving terminal, and having a cathode side of the second diode grounded; and a control terminal provided to a node between said transmitting terminal and said anode of said first diode,
   wherein said first and second diodes have a tradeoff relationship between ON resistance thereof and capacitance between said anode and said cathode of said first diode and between said anode and said cathode of said second diode, and the ON resistance of the first diode is tower than the ON resistance of the second diode, and the capacitance of the second diode in the OFF state is smaller than the capacitance of the first diode in the OFF state, and said third high frequency switch has a third diode having a cathode connected to between said antenna terminal of said second high frequency switch and a node of the cathode of said first diode of said second high frequency switch and said transmission line of said second high frequency switch and having an anode connected to a second receiving terminal, and a second control terminal connected to between said third diode of said third high frequency switch and said second receiving terminal, said third high frequency switch using the transmitting terminal of said first high frequency switch as a transmitting terminal of said third high frequency switch, and said third high frequency switch operating on the receiving side, by using said second diode of said second high frequency switch;

wherein the ON resistance of said first diode of said second high frequency switch and said third diode of said third high frequency switch are made lower than the ON resistance of said first diode of said first high frequency switch, and the capacitance of said second diode, in the OFF state, of said second high frequency switch is made smaller than the capacitance of said second diode, in the OFF state, of said first high frequency switch.

2. The three-band type of high frequency switch according to claim 1, wherein the ON resistance of said third diode of said third high frequency switch is lower than the ON resistance of said first diode of said second high frequency switch.

3. The three-band type of high frequency switch according to claim 1 or 2, wherein the ON resistance of said first diode of said first high frequency switch is not higher than 1Ω, and the ON resistance of said first diode of said second high frequency switch and said third diode of said third high frequency switch is not higher than 0.8Ω, and the capacitance of said second diode, in the OFF state, of said first high frequency switch is not larger than 0.8 pF, and the capacitance of said second diode, in the OFF state, of said second high frequency switch is not larger than 0.5 pF.

4. The three-band type of high frequency switch according to claim 3, wherein the ON resistance of said third diode of said third high frequency switch Is made not higher than 0.5Ω.

5. The three-band type of high frequency switch according to any one of claims 1 and 2, wherein the transmitting terminal, receiving terminal, and control terminal of said first high frequency switch, the transmitting terminal, receiving terminal, and control terminal of said second high frequency switch, the receiving terminal and control terminal of said third high frequency switch, and the antenna terminal common to said first high frequency switch, said second high frequency switch, and said third high frequency switch are provided on the surface of a laminated component having a plurality of dielectrics laminated therein, along with a ground terminal as electrode patterns for connecting parts, and electrode patterns for configuring said first high frequency switch, said second high frequency switch, said third high frequency switch, and said divider are provided in the interior of said laminated component, and said first diode, said second diode, and said third diode are mounted on the surface of said laminated component.

6. Radio communication equipment, comprising:

an antenna;

transmitting means or transmitting a signal from said antenna;

receiving means of receiving a signal from said antenna; and switch means of switching the connection between said antenna and said transmitting means or said receiving means, said switch means being a three-band type of high frequency switch according to any one of claims 1 and 2.

7. The three-band type of high frequency switch according to claim 1, wherein said first high frequency switch and said second high frequency switch further comprising an inductor element or a series circuit of LC connected in parallel with said first diode.

8. The three-band type of high frequency switch according to claim 1, wherein said first high frequency switch and said second high frequency switch further comprises a capacitor element or a parallel circuit of LC connected in series with said second diode.

* * * * *

UNITED STATES PATENT AND TRADEMARK OFFICE
CERTIFICATE OF CORRECTION

PATENT NO. : 7,109,531 B2
APPLICATION NO. : 10/975155
DATED : September 19, 2006
INVENTOR(S) : Kitazawa et al.

It is certified that error appears in the above-identified patent and that said Letters Patent is hereby corrected as shown below:

In column 15, line 5 of the Letters Patent, in claim 1 (Amendment claim 1), "is tower than" should read --is lower than--.

In column 16, line 4 of the Letters Patent, in claim 4(Amendment claim 5), "switch Is made" should read --switch is made --.

Signed and Sealed this

Sixth Day of February, 2007

JON W. DUDAS
*Director of the United States Patent and Trademark Office*